United States Patent
Agarwala et al.

[11] Patent Number: 6,033,939
[45] Date of Patent: Mar. 7, 2000

[54] METHOD FOR PROVIDING ELECTRICALLY FUSIBLE LINKS IN COPPER INTERCONNECTION

[75] Inventors: Birendra N. Agarwala, Hopewell Junction; Hormazdyar M. Dalal, Milton, both of N.Y.; Du B. Nguyen, Danbury, Conn.; Hazara S. Rathore, Stormville, N.Y.

[73] Assignee: International Business Machines Corporation, Armonk, N.Y.

[21] Appl. No.: 09/063,992

[22] Filed: Apr. 21, 1998

[51] Int. Cl.[7] ........................................ H01L 21/82
[52] U.S. Cl. .............................................. 438/132
[58] Field of Search .................... 438/128, 130, 438/132, 215, 281, 333, 467, 601

[56] References Cited

U.S. PATENT DOCUMENTS

| | | | |
|---|---|---|---|
| 3,619,725 | 11/1971 | Soden | 317/101 A |
| 4,740,485 | 4/1988 | Sharpe-Geisler | 437/246 |
| 5,070,392 | 12/1991 | Coffey et al. | 357/71 |
| 5,185,291 | 2/1993 | Fischer et al. | 437/173 |
| 5,340,775 | 8/1994 | Carruthers et al. | 437/246 |
| 5,472,901 | 12/1995 | Kapoor | 437/60 |
| 5,622,892 | 4/1997 | Bezama et al. | 438/601 |

FOREIGN PATENT DOCUMENTS 8321550 12/1996 Japan .

Primary Examiner—Joni Chang
Attorney, Agent, or Firm—Delio & Peterson LLC; John J. Tomaszewski; Tiffany L. Townsend

[57] ABSTRACT

A method is provided for the fabrication of fuses within a semiconductor IC structure, which fuses are delectable by a laser pulse or a low voltage electrical pulse typically below 3.5 V to reroute the electrical circuitry of the structure to remove a faulty element. The fuses are formed on the surface of circuitry which is coplanar with a surrounding dielectric such as the circuitry formed by a Damascene method. A preferred fuse material is silicon-chrome-oxygen and the preferred circuitry is copper.

13 Claims, 2 Drawing Sheets

//<sub></sub>
METHOD FOR PROVIDING ELECTRICALLY FUSIBLE LINKS IN COPPER INTERCONNECTION

BACKGROUND OF THE INVENTION

1. Field of the Invention

The present invention generally relates to the fabrication of microfuses within a semiconductor structure and, more specifically, to a fuselink and process of fabricating a fuselink which is compatible with advanced CMOS technology having copper interconnections defined by a Damascene method and 2.5 volt circuitry, which fuselinks would be delectable either by a laser pulse or by a low voltage electrical pulse.

2. Description of Related Art

In the fabrication of integrated circuit (IC) structures, fusible links play an important role in improving the yield of the fabrication process. In general, it is desirable to provide redundancy in certain elements of the circuitry of an electronic component and the faulty element could be removed via a fuse and the component still be used. Two types of such fuses are in use. In one type, the fuse element is blown using an external heat source, e.g., laser beam. In a second type, the fuse is blown by flowing an electrical current through the fuse element. Electrical fuses are preferred as the fuse blow operation could be automated with a circuit test.

Three paramount requirements for a fuse are: a) material and process compatibility with thin film processes used to make the component; b) be capable of a clean blow meaning that a minimal amount of residue is left after the blow; and c) voltage compatibility with the circuitry used if an electrical blow is used.

The rapid increase of hand held IC devices has opened up a new world of low voltage circuitry for weight and power conservation. These type IC devices require a fuse which could be blown clean at or below 2.5 V. The low power circuitry also requires very high conductivity interconnection lines in the device. To meet this requirement, copper metallurgy is the preferred choice; which, in turn, mandates use of a Damascene process to make the device. Aluminum may also be employed to form the interconnection lines using known procedures.

In general, multilayer electronic components comprise multiple layers of a dielectric material having metallization on each layer in the form of vias, pads, straps connecting pads to vias and wiring. Vias or other openings in the dielectric layer extend from one layer to another layer. These openings are filled with a conductive material and electrically connect the metallization on one layer to the metallization on another layer and provide for the high density electronic components devices now used in industry.

An important aspect of multilayer electronic components is the via or openings between layers in which a conductive material is applied to provide electrical contact between the metallization on different layers. Broadly stated, the typical multilayer electronic component is built up from a number of layers of a dielectric material layer such as silicon oxide, fluorinated silicon oxide, polymers including polyimide and fluorinated polyimide, ceramics, carbon and other dielectric materials. In the processing sequence known in the art as the "Damascene Process", the dielectric layer is patterned using known techniques such as the use of a photoresist material which is exposed to define the wiring pattern. After developing, the photoresist acts as a mask through which a pattern of the dielectric material is removed by a subtractive etch process such as plasma etching or reactive ion etching. This is generally termed a lithography or photolithography process and may be used for both additive or subtractive metallization procedures as is known in the art.

Using the Damascene Process, openings defining wiring patterns are provided in the dielectric layer, extending from one surface of the dielectric layer to the other surface of the dielectric layer. These wiring patterns are then filled with a metallization metal using a filling technique such as electroplating, electroless plating, chemical vapor deposition, physical vapor deposition or a combination of methods. This process may include planarization of the metal on the surface of the dielectric by removing excess metallization with a method such as chemical mechanical polishing (CMP).

In the Single Damascene Process, vias or openings are additionally provided in the dielectric layer and filled with metallization to provide electrical contact between layers of wiring levels. In the Dual Damascene Process, the via openings and the wiring pattern openings are both provided in the dielectric layer before filling with metallization. This process simplifies the procedure and eliminates some internal interfaces. These procedures are continued for each layer in the electronic component until the electronic component is completed.

Various aspects of fuselinks in integrated circuits are described in U.S. Pat. Nos. 3,619,725 to Soden and Greig; 5,070,392 to Coffey and Hollingsworth; 5,185,291 to Fischer et al.; and 5,472,901 to Kapoor. Soden and Greig disclose a fuse structure comprising a thin film of titanium with or without a thin film of platinum, which is also the underlayer of titanium-platinum-gold interconnection lines used therein. The Ti—Pt—Au metallurgy typically suffers from resistance increase due to Pt and Au alloying. Further, platinum or gold is not compatible with the widely used aluminum interconnection metallurgy. In the Soden and Greig fuse, hundreds of miliamps of current is shown to be required to blow the fuse; such high current is not compatible with low voltage IC technologies. The fuse is also formed simultaneously with the interconnection circuit pattern.

Coffey and Hollingsworth also teach use of the underlayer of the interconnection line metallurgy as the fusible link. Coffey and Hollingsworth first form the interconnection line pattern and then remask to expose fusible link areas. The overlaying aluminum in these exposed areas is then chemically etched. This method is not applicable to copper metallurgy which requires a Damascene method. Further, Coffey and Hollingsworth profess use of a laser blow only.

Fischer et al. discloses a process where the thickness of interconnection lines is locally reduced to form the fuse link. Fischer et al. first deposit only half the required thickness of interconnection lines, photolithographically etch all of the metal where fuse links are to be formed, deposit other half thickness of metal and subtractively etch to form interconnection lines. Thus, the fuselinks are formed with half the thickness of metal lines. This method is not compatible with the current metallurgical schemes, all of which require an underlayer. Further, the interface formed between the top and the bottom half of the interconnection thickness is known to be preferred sites for void accumulation causing degraded reliability. Fischer's scheme is also incompatible with processes required for copper metallurgy.

Kapoor shows a method for integrating tungsten fuselinks with tungsten via studs. Fuselinks formed are in a picture frame shape which requires twice the current to blow the fuse because the current is divided into the two parallel branches. Further, the method is based upon the area dependence of polishing rate with higher polishing rate resulting in wider areas. This results in an inconsistent amount of tungsten being left along the sidewalls of the fuse recess resulting in poor fuse yield.

Carruthers et al. U.S. Pat. No. 5,340,775, assigned to the assignee of the present application, shows a method for making SiCr fuselinks integrated with aluminum metallurgy interconnection lines. To protect the SiCr fuselinks from harsh chemicals used for aluminum RIE, an overlayer of tungsten is used. This tungsten layer also forms an underlay for aluminum circuitry.

All the above patents are hereby incorporated by reference.

As cited above, the choice of fuse material in the prior art is often constrained to the material and process being used in the definition of interconnection lines. For example, an aluminum fuse in aluminum metallurgy, or use of the metallurgy of the barrier layer of interconnection lines etc. This results in use of a fuse thickness which is the same as that being used to define the interconnection lines. Such schemes necessarily make the desired electrical fuse blow techniques inoperable for many applications and one has to resort to a laser blow techniques. The reason for such fuse material constrains is erroneously said to be process simplicity or cost effectiveness. The laser blow operation, however, requires another mask application to remove the insulation layer above the fuse, requires expensive laser tools, adds logistics to keep track of which fuse in which chip is to be blown, and consumes more time than electrical fuse blow methods which could be automated with a device final test.

For a fuse to be electrically delectable at a low voltage, the role of various material properties, fuselink geometries, and electrical current requirement could be obtained from the following formula:

$$i^2 \propto \frac{E_f \cdot \rho_m \cdot A^2}{\rho_e}$$

where, i, is the current required to blow the fuse;
$E_f$ is the fusion energy of the use material;
$\rho_m$ is density of fuse material,
A, is the cross-sectional area of the fuse link; and
$\rho_e$, is the electrical resistivity of the fuse material.

For minimum fuse blow current one must choose a fuse material with low density, low fusion energy, and high electrical resistivity. The above equation shows that minimization of cross-sectional area of the fuselink has the strongest effect in reducing the fuse blow current. Further, the length of fuselink is not in the equation; hence, fuse length should be minimized as that would result in the highest available current for a given voltage.

Despite repeated efforts in the prior art, however, problems of poor fabrication process yield, process incompatibility, ability for clean electrical fuse blow, etc., remain and better methods for making reliable fuse links need to be developed.

Bearing in mind the problems and deficiencies of the prior art, it is therefore an object of the present invention to provide a method for fabricating reliable, high process yield, microfuse links in semiconductor integrated circuit devices.

It is another object of the present invention to provide a method for fabricating integrated circuit fuse links, the method being compatible with copper metallurgy and the Damascene process.

A further object of the invention is to provide a fuselink in integrated circuit devices which is delectable by laser pulses or by electrical pulses.

It is yet another object of the present invention to provide a fuse in an integrated circuit device which could be electrically blown at below about 3.5 V, typically 1.5 V to 3 V.

It is another object of the present invention to provide an integrated circuit device article of manufacture containing fuses made using the method of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method for forming at least one fuse, delectable by low voltage electrical pulses or by laser pulses, for the purpose of rerouting various components of an integrated circuit, the fuse being formed on a planarized surface of exposed interconnection circuitry and surrounding internal insulation, the method comprising the steps of:

forming a planarized surface comprising circuitry lines and surrounding internal insulation;

depositing a thin layer of a fuse material on the planarized surface;

defining the size and shape of the fuses and the circuitry connected by the fuses preferably using a photoresist;

exposing the photoresist;

developing the exposed photoresist;

etching the exposed layer of fuse material;

stripping the remaining photolithographic photoresist material;

depositing at least one layer of final insulating and passivating material on the fuse defined planarized surface;

forming, preferably by a damascene method, at least two via studs with each stud contacting circuitry linked by the fuse; and forming metal pads on the upper surface of the final insulating and passivating layer contacting the via studs.

In another aspect of the invention an article of manufacture is provided comprising a semiconductor integrated circuit device comprising exposed interconnection circuitry lines and surrounding internal insulation on a planarized surface of a semiconductor substrate and at least one fuse link electrically connecting the exposed surfaces of at least two interconnection lines, the fuse link being used for the purpose of rerouting the circuit by deleting the fuse link by low voltage electrical pulses or by laser pulses.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(S)

Figure 1:
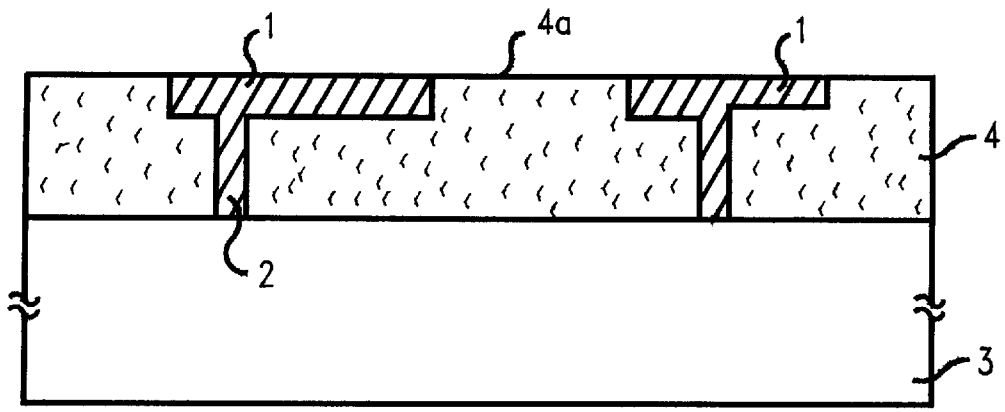
FIG. 1 is a simplified cross-sectional view of a conventional semiconductor substrate having interconnection lines and vias formed by a Double Damascene method.

In describing the preferred embodiment of the present invention, reference will be made herein to FIGS. 1–4 of the drawings in which like numerals refer to like features of the invention. Features of the invention are not necessarily shown to scale in the drawings.

Referring now to FIG. 1 there is shown copper interconnection lines 1 and via studs 2 defined on a semiconductor substrate 3. It is understood that the substrate 3 is a semiconductor multilayer substrate having a plurality of semiconductor devices and lower levels of interconnection lines and contact studs defined by methods of the prior art. It is further understood that integrated lines 1 and via studs 2 are defined by a Double Damascene method of the prior art. In such damascene methods, interconnection lines 1 are essentially coplanar with the upper surface 4a of a surrounding insulating and passivating layer 4. The interconnection metallurgies typically contain a liner under the high conductivity metal or alloy (not shown). It should be recognized that the present invention does not rely upon use of a liner or of a particular liner. Further, the present invention could be practiced independent of the method of definition of interconnection lines with the essential requirement being that the top surface of the interconnection lines defined for the last interconnection level be essentially coplanar with the surrounding insulation. It is understood that such coplanarity is a given feature in a Damascene method currently practiced widely in the industry to define ultra fine width lines. The Damascene method is also the lone choice today where definition of fine line pattern in copper metallurgy is desired. The method of the invention can also be used for internal layers of the multilayer substrate, but these fuses will not be laser delectable.

Figure 2:
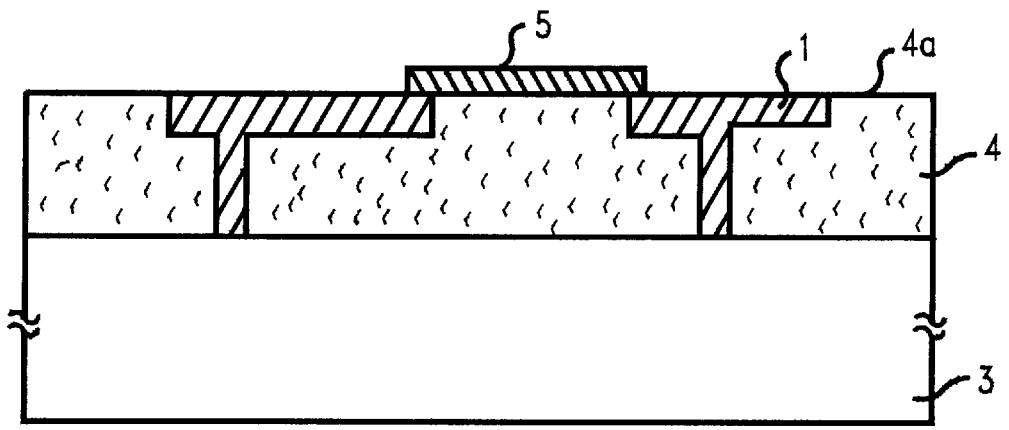
FIG. 2 is a cross-sectional view of the substrate of FIG. 1 containing a fuse of the invention.

Starting with the circuit containing substrate of FIG. 1, a thin layer of a fuse material 5 is deposited and patterned on the surface 4a as shown in FIG. 2. The essential planar surface 4a of the substrate allows deposit of a very thin layer of fuse material, in the order of 100 Å to 500 Å without defects.

The choice of fuse material is important as discussed above. Metallurgically, an alloy, for example, an aluminum alloy with copper or silicon, should be avoided because such alloys have a range of melting point which pose difficulty in effecting a clean delete and leave a trace amount of material after fuse blow. In such cases, even though the resistance is in hundreds of mega ohms after the fuse blow, with time such residual debris metal corrode thereby forming an ionic leakage path to destroy the purpose of fuse blow. Similar problems also arise when fuse materials comprising of layered metals, e.g., Ti/Pt, Ta/TaN, Ti/TiN, etc. are used. Alloys of pure metals like gold or platinum, which do not oxidize, are incompatible with the commonly used interconnection line metallurgy of copper or aluminum.

There are elements, like some elements in Group IV of the Periodic Table of chemical elements, whose oxides are stable in the presence of moisture. Such elements, for example, silicon, germanium, carbon, or compounds thereof, can be used for fuse links. Another set of materials that can be used for fuse links are intermetallic compounds which have a single melting point like pure metals. Three factors dictate the choice of an intermetallic compound for application as a fuse link. First, the intermetallic compound should be relatively ion etchable with gas, especially a fluorine based gas. Second, each element of the intermetallic compound preferably have a vapor pressure close to each other, otherwise incomplete fuse blow results. Third, as discussed above, blown fuse debris should form a stable oxide.

Exemplary metallic fuse materials include silicon-chromium-oxygen, tantalum, tantalum nitride, titanium, titanium-nitride, tungsten, tungsten-silicon, silicon, germanium or their compounds with carbon.

In one embodiment of the present invention, a thin film of thickness 100 Å to 500 Å of silicon, germanium, silicongermanium, silicon carbide, germanium carbide is deposited. As discussed above, a thin film of intermetallic compound, such as 33% Cr-63% Si and 4% O can also be used. For silicon, germanium, or their compounds, PECVD, or preferably sputtering, could be used for deposition. For deposition of intermetallic compounds, especially for Si—Cr, sputtering with a trace amount of oxygen, in the range of 0 to 5 volume percent of argon, is preferred. The incorporation of a slight amount of oxygen in intermetallic compound films plays several roles. First, the intermetallic compound films with incorporated oxygen atoms reduce the temperature coefficient of resistance. Second, the films are chemically more inert. Third, the supply of oxygen atoms ensures the blown fuse metal debris to be oxidized. Preferred fuse link material are Si—Cr—O, Si and SiC.

Figure 3:
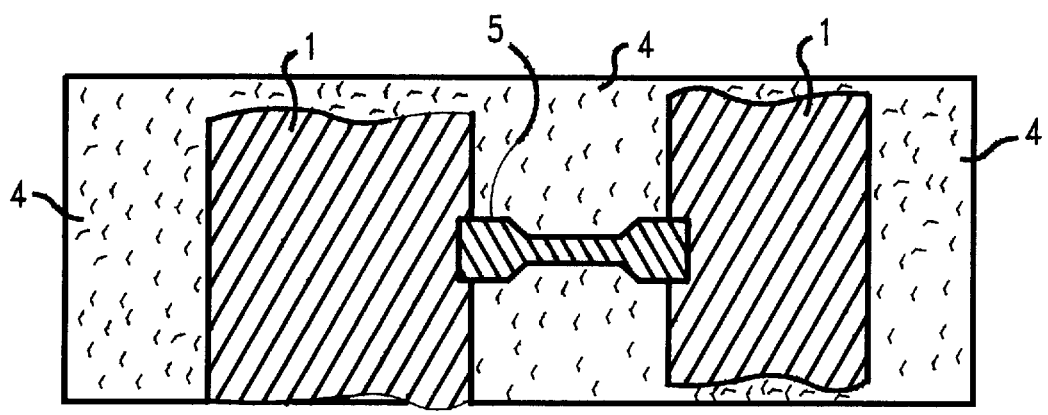
FIG. 3 is the top view of the substrate of FIG. 2.

The next process step is to photolithographically define a pattern for fuselinks and etch, e.g., reactive etch (RIE) the film with preferably a fluorine based gas, for example, $CHF_3$. FIG. 2 shows the cross-section of the fuse link 5 formed between the adjacent metal lines 1 of the last metal level of IC chip interconnection lines. In FIG. 3 is shown the plan view of the interconnection lines, and the fuse link 5. Because the thickness of the fuse film 5 is less than 500 Å, a line width down to 500 Å could theoretically be defined; however, the present lithographic capability is limited to about 1500 Å. With a fuselink having a length of 0.5 micron, a width of 2000 Å, and a resistivity of 30 micro-ohms-cm for Si—Cr—O, a fuse link is obtained having a resistance of 15 ohms which would allow a current up to 160 mA (milliamps) to flow at 2.5 V. In CMOS circuits, the current flow is usually below 1 mA, hence, the fuse will provide adequate conductively between circuit elements. When the fuse needs to be blown, even at 2.0 V, the power supplied to the fuse link will exceed 1 $MW/CM^2$, which is more than adequate to blow the fuse of FIG. 3. Because of the small geometry of fuselinks, the maximum volume of material needed to be removed in the fuse of the invention is less than 0.00005 $\mu^3$; which is much smaller than fuse material needed to be removed in fuse schemes of the prior art. It is preferred to blow the fuse at below about 3.5 V, typically 1.5 to 3.5 V.

The fuse link width is typically less than 1 micron in the narrow region and preferably less than 0.25 micron. The length of the fuse link is typically less than 1 micron in the narrow region, preferably less than 0.5 micron. The fuse link preferably has a narrow region as shown in FIG. 3.

Figure 4:
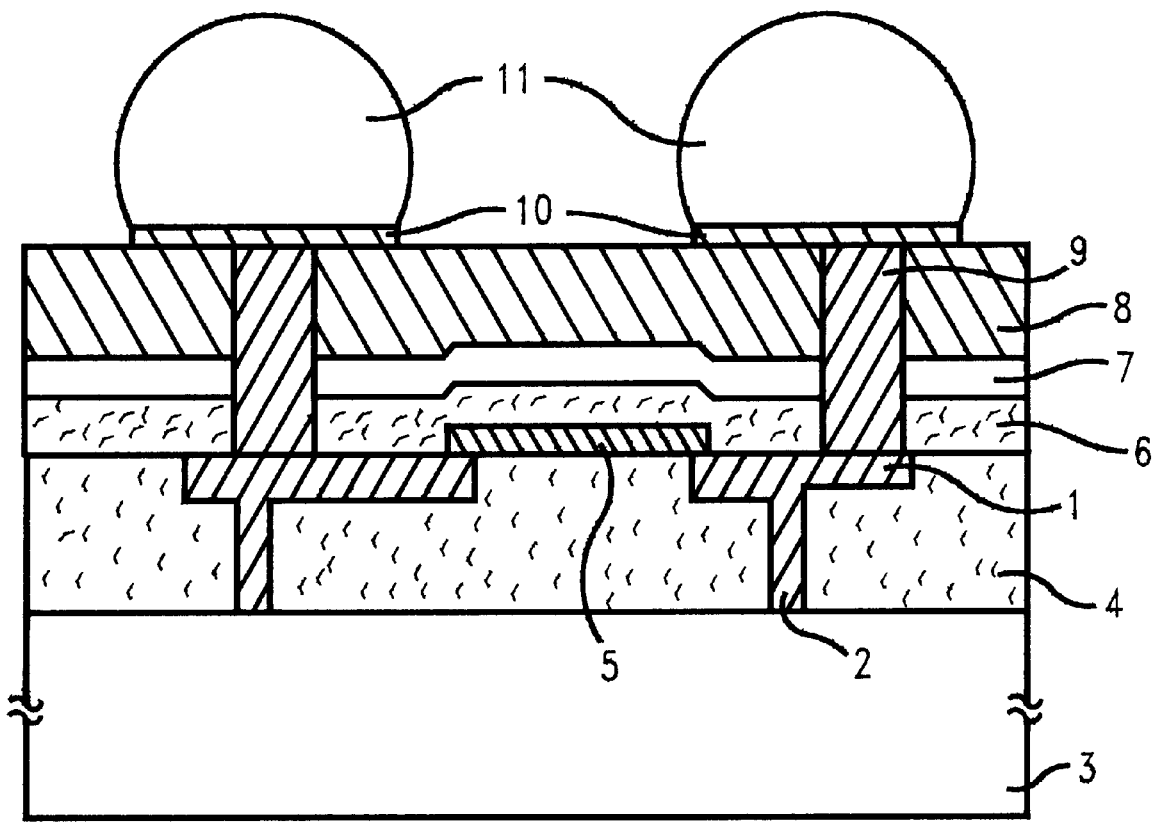
FIG. 4 is a cross-sectional view of a substrate having a fuselink of the present invention which substrate is provided with C-4 solder bumps for bonding the substrate to a chip or other component.

Using the fuse structure of FIG. 3, FIG. 4 shows sequentially deposited layers of silicon oxide 6, silicon nitride 7 and polyimide 8 on dielectric layer 4, interconnection lines 1 and fuselink 5. Terminal via studs 9 of copper metallurgy are next formed by Damascene methods of prior art. The thin fuse structure does not interfere with the processes of stud 9 formation. Standard C4 solder balls 11 on BLM pads 10 are formed in accordance with methods of prior art.

In another embodiment of the present invention, a conductive organic material is used for the fuse material. Polymers of the group polyanilines, for example, show electronic conductivity in the range of 15 to 90 micro-ohm-cm. An advantage of using polyanilines is that they could be spun on the surface. Another advantage is that polyanilines are extremely passive to corrosion. Yet another advantage is that the heat generated by the passing of a high current to delete the fuse oxidizes the polyanilines thereby giving an oxidized material having a very high resistance. No material is evaporated as in metallic fuses, hence, no material spattering takes place. Still another advantage is that the highly resistive oxidized polyaniline changes color, hence, it offers an easy inspection for quality control. The polyanilines could be etched with RIE using oxygen, hence, it is compatible with the copper metal or the oxide passivation of FIG. 3. Except for the fuse material and its deposition and etching method, the rest of the process steps are similar as for metallic fuses.

Thus, the invention provides a conductive link between circuit elements which could be formed with simple processes, using simple materials and deposition methods compatible with copper metallurgy, and most of all could be reliably deleted or made resistive at 2 V to 3 V with high process yield.

It should be apparent that given the guidance and the illustrations set forth herein, alternate embodiments of the processes, materials and structures of the present invention may be suggested to be a skilled artisan. For example, the C4 solder balls could be replaced with pads for wire bond or TAB. The insulator could include flowable oxide, diamond like carbon, or an organic component or a combination thereof.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

We claim:

1. A method for forming at least one fuse, delectable by low voltage electrical pulses or by laser pulses for the purpose of rerouting various components on an integrated circuit, the fuse being formed on a planarized surface of exposed interconnection circuitry lines and surrounding internal insulation, the method comprising the steps of:

forming a planarized surface comprising the circuitry lines and surrounding internal insulation;

depositing a thin layer of a fuse material on the planarized surface;

defining the size and shape of the fuses and the circuitry lines connected by the fuses using a photolithographic photoresist material;

exposing the photoresist;

developing the exposed photoresist;

etching the exposed layer of fuse material;

stripping the remaining photolithographic photoresist material;

depositing at least one layer of final insulating and passivating material on the fuses defined planarized surface;

forming, by a damascene method, at least two via studs with each stud contacting the circuitry lines linked by the fuse; and forming metal pads on the upper surface of the final insulating and passivating layer contacting the via studs.

2. The method of claim 1 wherein the fuse material is metallic or organic.

3. The method of claim 2 wherein the metallic fuse material is selected from the group consisting of silicon-chromium-oxygen, tantalum, tantalum nitride, titanium, titanium-nitride, tungsten, tungsten-silicon, silicon, germanium, silicon carbide and germanium carbide.

4. The method of claim 2 wherein the organic fuse material is a polyaniline.

5. The method of claim 1 wherein the interconnection circuitry lines are copper or aluminum based metallurgies.

6. The method of claim 1 wherein the fuse material is deposited by a method chosen from a group comprising of sputtering, reactive-sputtering, PECVD, spinning, and any combination thereof.

7. The method of claim 1 wherein the etching is done by reactive ion etching using fluorine based gas or oxygen.

8. The method of claim 1 wherein the fuse linking the interconnection circuitry lines could be deleted by flowing a required amount of electrical current at voltages below about 3.5 V.

9. The method of claim 1 wherein the fuse linking the interconnection circuitry lines could be deleted by laser pulses.

10. The method of claim 1 wherein the via studs are aluminum based or copper based metallurgies.

11. The method of claim 1 wherein the pads are used for wire bonding, TAB connection, or C4 solder ball formation.

12. The method of claim 11 wherein the pads are aluminum based or copper based metallurgies.

13. The method of claim 12 wherein the pads for the copper based metallurgies are chosen from a group comprising of chromium, copper, gold, tantalum, tantalum-nitride, nickel and titanium-tungsten.

* * * * *

UNITED STATES PATENT AND TRADEMARK OFFICE
CERTIFICATE OF CORRECTION

PATENT NO. : 6,033,939
DATED : March 7, 2000
INVENTOR(S) : Argarwala et al.

It is certified that error appears in the above-identified patent and that said Letters Patent is hereby corrected as shown below:

Column 3, line 34, delete "delectable" and substitute therefor
-- deletable --.

Column 4, line 4, delete "delectable" and substitute therefor
-- deletable --.

Column 4, line 20, delete "delectable" and substitute therefor
-- deletable --.

Column 7 line 49, delete "delectable" and substitute therefor
-- deletable --.

Signed and Sealed this

Thirteenth Day of February, 2001

Attest:

NICHOLAS P. GODICI

Attesting Officer

Acting Director of the United States Patent and Trademark Office